United States Patent [19]

Fukahori

[11] Patent Number: 5,550,512
[45] Date of Patent: *Aug. 27, 1996

[54] METHOD FOR OFFSET VOLTAGE TRIM FOR AUTOMATIC GAIN CONTROLS

[75] Inventor: Kiyoshi Fukahori, Tokyo, Japan

[73] Assignee: Silicon Systems, Inc., Tustin, Calif.

[*] Notice: The term of this patent shall not extend beyond the expiration date of Pat. No. 5,432,475.

[21] Appl. No.: 470,087

[22] Filed: Jun. 6, 1995

Related U.S. Application Data

[63] Continuation of Ser. No. 260,065, Jun. 15, 1994, Pat. No. 5,432,475.

[51] Int. Cl.[6] .................................. H03F 3/45; H03G 3/30
[52] U.S. Cl. .......................................... 330/254; 330/261
[58] Field of Search ........................................ 330/254, 261

[56] References Cited

U.S. PATENT DOCUMENTS 3,927,382  12/1975  Oki ............................................ 330/254
4,109,214  8/1978  Main ......................................... 330/254

Primary Examiner—James B. Mullins
Attorney, Agent, or Firm—Hecker & Harriman

[57] ABSTRACT

A method for providing DC offset trim for automatic gain controls independent of temperature or gain. A DC trim current is added or subtracted from one side of the differential AGC circuit. The trim current balances the currents through the two halves of the differential circuit, eliminating DC offset at the AGC output. The trim current is derived from a current source that is dependent upon another current source that provides the current through the two halves of the differential circuit. Therefore, the trim current responds to any changes in the current supplied to the differential AGC circuit. Thus, DC offset trim independent of temperature or gain, as well as reduction of the total harmonic distortion and direct DC coupling of signals between stages, is provided.

19 Claims, 3 Drawing Sheets

5,550,512

METHOD FOR OFFSET VOLTAGE TRIM FOR AUTOMATIC GAIN CONTROLS

This is a continuation of application Ser. No. 08/260,065 filed Jun. 15, 1994, and now U.S. Pat. No. 5,432,475.

BACKGROUND OF THE INVENTION

1. Field of the Invention

The present invention relates generally to automatic gain controls (AGCs) and, in particular, to a method of offset voltage reduction for AGCs.

2. Background Art

Electronic circuits are often used to process signals. It is often desirable to provide signals at a predictable, fixed amplitude or level. However, such signals are not always available. Thus, it is useful to be able to adjust the amplitude of signals to maintain a desired level. An AGC circuit may be used to perform this adjustment. An AGC circuit includes an amplifier capable of providing variable gain. The AGC circuit monitors the output of the variable gain amplifier and compares the amplitude of the output to a reference level. If the amplitude of the output exceeds the reference level, the AGC circuit reduces the gain of the variable gain amplifier. If the amplitude of the output is less than the reference level, the AGC circuit increases the gain of the variable gain amplifier. By adjusting the gain of the variable gain amplifier, the AGC circuit provides an output having a predictable amplitude range.

AGC circuits are typically used to amplify AC signals, pulsed DC signals or other time dependent signals. When the input signal is removed, it is desirable for the output to be zero. However, device mismatches and other nonideal conditions may result in an AC signal being superimposed on a DC offset. The DC offset is typically affected by changes in the temperature and/or gain of the AGC. Even if the AC signal is removed or set to a zero level, the DC offset is still present at the output as a nonzero level. The DC offset is not representative of the AC signal applied to the amplifier and typically increases the total harmonic distortion of the AGC circuit. To ensure accurate, undistorted amplification of the applied input signal, the DC offset should be removed. To eliminate this DC offset, a method of offset voltage trim is needed.

In the past, typically, the output of an AGC circuit was differentially AC coupled to other circuitry to remove DC offsets. The AC coupling required the addition of four pins to an integrated circuit (IC) package, thereby increasing the size and complexity of the IC. Two external capacitors were also required to provide AC coupling of a differential AGC output signal. The two capacitors were coupled to the additional four pins of the IC, AC coupling the differential AGC output pins to the respective differential input pins of the subsequent circuitry. The increased number of components and complexity of connections increased the difficulty and cost of manufacturing such an AGC circuit and decreased its reliability. Thus, a more efficient and reliable method of reducing the DC offset of an AGC circuit is needed.

SUMMARY OF THE INVENTION

The present invention provides a method of offset voltage trim for AGCs. The present invention avoids the temperature and gain dependence of the prior art methods. The present invention reduces the total harmonic distortion due to device mismatches. The present invention also avoids the need for external components for AC coupling by allowing direct DC coupling of signals to the following stage.

The present invention applies to a class of AGC circuits which has a first differential pair of input transistors coupled to a first current source and a second differential pair of output transistors coupled to a second current source. A DC trim current is added to one side or the other side of the inputs of the second differential pair. The trim current eliminates, to a first order, DC offset at the AGC output. The trim current is derived from a current source that is dependent upon the first current source. Therefore, the trim current responds to any changes in the current supplied to the first differential pair. The first order compensation for any changes resulting from variations in temperature, gain or other parameters is provided.

In the preferred embodiment of the present invention, a trim current source dependent upon the first current source is coupled to a plurality of transistors, each transistor having a unique semiconductor area related to the semiconductor area of the other transistors by powers of two. The transistors are switchably coupled to either side of the second differential pair inputs.

To achieve an offset free AGC circuit, its DC offset voltage is measured under static conditions. The polarity of the DC offset voltage is determined and the side of the differential circuit to which the DC trim current is to be applied is identified. A polarity switch is positioned so as to provide the trim current to the correct side of the differential circuit. The magnitude of the DC offset voltage is also determined and magnitude switches are positioned so as to select the appropriate combination of area weighted transistors to produce the proper trim current. The trim current of the correct polarity and magnitude is then applied to the differential AGC circuit, eliminating the DC offset under static conditions. Since the trim current source is dependent upon the first current source, the magnitude of the trim current changes in response to changes in gain and/or temperature.

The preferred embodiment of the present invention may be fabricated entirely on an integrated circuit, thereby eliminating the need for external components. Thus, the disadvantages of the prior art have been overcome.

DETAILED DESCRIPTION OF THE INVENTION

A method of offset voltage trim for automatic gain controls is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

Differential circuits require well-matched components to ensure high common mode rejection ratios and to minimize DC offset voltages. DC offset voltages must be minimized to avoid the need for external components to AC couple an output to other circuitry. Therefore, a method of minimizing DC offset voltages is needed.

The present invention provides a DC trim current to a differential circuit to compensate for component mismatches and other parameter variations in the AGC circuit. With no input signal present, the trim current is adjusted so that the DC component of the output signal is zero. The trim current source is responsive to changes in a current source that provides current flowing through the first differential pair. As the temperature, the gain or other parameters change, the current through the differential pair changes. Accordingly, the trim current source adjusts to these changes to maintain zero DC offset voltage.

Figure 1:
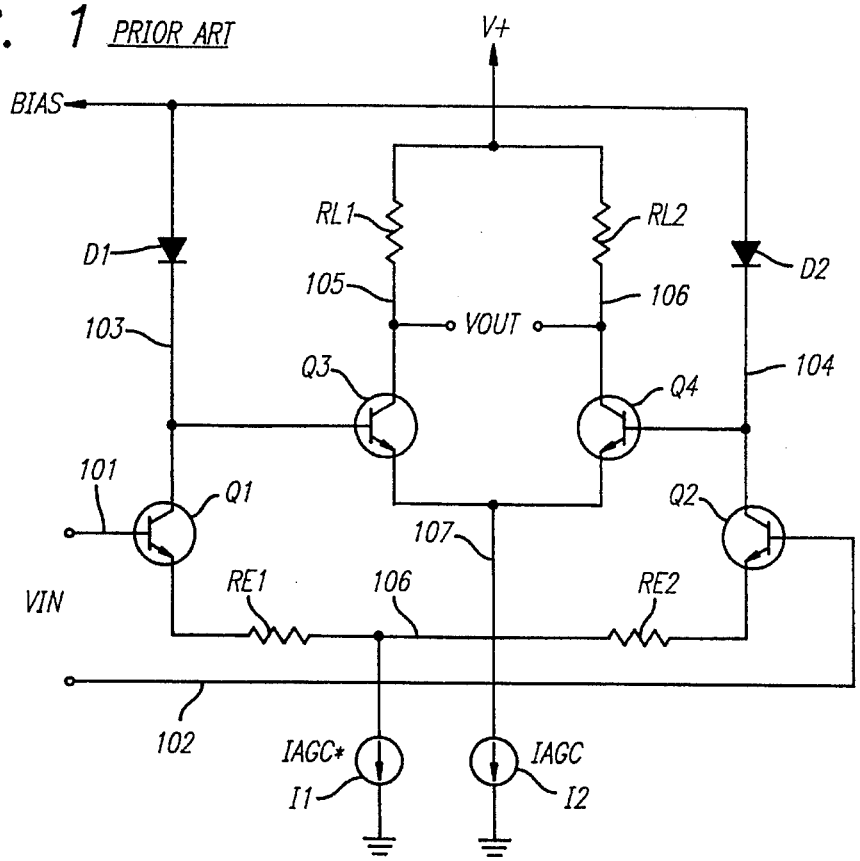
FIG. 1 illustrates schematic diagram of a typical AGC circuit.

FIG. 1 illustrates a schematic diagram of a typical AGC circuit. Differential input VIN is provided across nodes 101 and 102. Node 101 is coupled to the base of transistor Q1. Node 101 is coupled to the base of transistor Q1. Node 102 is coupled to the base of transistor Q2. The emitter of transistor Q1 is coupled to the first terminal of resistor RE1. The emitter of transistor Q2 is coupled to the first terminal of resistor RE2. The second terminal of resistor RE1 is coupled to the second terminal of resistor RE2, to node 106 and to the first terminal of current source I1. The second terminal of current source I1 is coupled to ground.

The collector of transistor Q1 is coupled to node 103, to the cathode of diode D1 and to the base of transistor Q3. The collector of transistor Q2 is coupled to node 104, to the cathode of diode D2 and to the base of transistor Q4. The anode of diode D1 is coupled to the anode of diode D2 and to voltage BIAS. The emitter of transistor Q3 is coupled to the emitter of transistor Q4, to node 107 and to the first terminal of current source I2. The second terminal of current source I2 is coupled to ground. Positive supply voltage V+ is coupled to the first terminal of resistor RL1 and to the first terminal of resistor RL2. The second terminal of resistor RL1 is coupled to the collector of transistor Q3 and to node 105. The second terminal of resistor RL2 is coupled to the collector of transistor Q4 and to node 106. Differential output VOUT is provided across nodes 105 and 106.

The circuit of FIG. 1 provides amplification with a gain, denoted as AV, described by the following equation:

$$AV \equiv \frac{RL}{RE} \cdot \frac{IAGC}{IAGC^*}$$

Typically, the sum of current IAGC and current IAGC* is held constant, and the ratio of the currents (IAGC/IAGC*) is adjusted to control the gain of the AGC. An offset voltage will exist at output VOUT if any of the following component pairs are mismatched: Q1 and Q2, RE1 and RE2, Q3 and Q4, D1 and D2, or RL1 and RL2. The offset voltage is typically most significant for higher gain settings and, as such, is most pronounced for mismatches of Q3 and Q4, Di and D2, or RL1 and RL2.

In FIG. 1, a voltage applied across differential input VIN is amplified by transistor pair Q1/Q2 and transistor pair Q3/Q4, and an output is produced across output terminals VOUT. The gain of the amplifier may be adjusted by changing the relationship between current IAGC* provided by current source I1, and current IAGC provided by current source I2.

In the circuit of FIG. 1, the differentially paired components nominally have the following values:

Area of Q1=Area of Q2

Area of Q3=Area of Q4

Area of D1=Area of D2

RE=RE1=RE2

RL=RL1=RL2.

The gain of the circuit of FIG. 1 is proportional to the ratio of IAGC to IAGC*

$$\text{Gain} = \frac{I1}{I2} \cdot \frac{RL}{RE},$$

where I1 is the value of IAGC* and I2 is the value of IAGC.

The input-referenced offset voltage, VOI, is given by the following equation:

$$VOI \cong VT \cdot (\% \text{ mismatch of } Q1, Q2) + \frac{I1 \cdot RE}{2} \cdot$$

$$\left[ \begin{array}{c} \% \text{ mismatch of} \\ (Q3, Q4 + D1, D2 + RE1, RE2 + RL1, RL2) \end{array} \right],$$

where VT=k·T/q, the thermal voltage.

The offset voltage at the output, VOO, is given by the following equation:

$$VOO = VOI \cdot \text{Gain}$$

$$\therefore VOO = VOI \cdot \frac{RL}{RE} \cdot \frac{IAGC}{IAGC^*} = VT \cdot$$

$$(\% \text{ mismatch of } Q1, Q2) \cdot \text{Gain} + \frac{RL \cdot I2}{2} \cdot$$

$$\left[ \begin{array}{c} \% \text{ mismatch of} \\ (Q3, Q4 + D1, D2 + RE1, RE2 + RL1, RL2) \end{array} \right]$$

Since $$\left. \frac{RL \cdot I2}{2} \right|_{max} >> VT \cdot \text{Gain},$$

the percent mismatch of Q3/Q4, D1/D2, RE1/RE2, and RL1/RL2 is more significant than the percent mismatch of Q1/Q2. In a typical AGC application, the former may be several times more significant than the latter. Thus, to eliminate DC offset voltages at the output, it is more important to compensate for the mismatch of pairs Q3/Q4, D1/D2, RE1/RE2, and RL1/RL2. In the following analysis, Q1 is assumed to be perfectly matched to Q2 and RE1 is assumed to be perfectly matched to RE2.

The variables IX, ε1, ε2, and ε3 are defined as follows:

IX=offset compensation current drawn from the base of Q4 to the ground

ε1=error due to mismatch of Q3 & Q4 pair

ε2=error due to mismatch of D1 & D2 pair

ε3=error due to mismatch of RL1 & RL2 pair

The following is a loop equation around D1, Q3, D4 and D2:

$$VT \left( \ln \frac{\frac{I1}{2}}{ISD1} + \ln \frac{I3}{ISQ3} - \ln \frac{I4}{ISQ4} - \ln \frac{\frac{I1}{2} + IX}{ISD2} \right) = 0$$

or

-continued $$VT \cdot \ln\left(\frac{\frac{I1}{2}}{\frac{I1}{2}+IX} \cdot \frac{ISD2}{ISD1} \cdot \frac{I3}{I4} \cdot \frac{ISQ4}{ISQ3}\right) = 0,$$

where ISD1, ISD2, ISQ3 and ISQ4 refer to the saturation currents of the diodes D1 and D2 and transistors Q3 and Q4, respectively. For this expression to be satisfied, the argument for the natural log function (which is enclosed within parentheses above) must necessarily be equal to 1.0, i.e., $\frac{\frac{I1}{2}}{\frac{I1}{2}+IX} \cdot \frac{ISD2}{ISD1} \cdot \frac{I3}{I4} \cdot \frac{ISQ4}{ISQ3} = 1.0.$  Equation (a)

For zero offset, $I3 \cdot R4$ and $I4 \cdot RL2$ must be equal to one another.

If $RL2 = RL1 \cdot (1 + \epsilon 3)$, then $I3/I4 = 1 + \epsilon 3$.  Equation (b)

If $\frac{ISD2}{ISD1} = 1 + \epsilon 2$  (Equation (c))

and $\frac{ISQ4}{ISQ3} = 1 + \epsilon 1,$  (Equation (d))

by substituting Equations (b), (c) and (d) in Equation (a), the following equation results:

$$\frac{\frac{I1}{2}}{\frac{I1}{2}+IX}(1+\epsilon 1)(1+\epsilon 2)(1+\epsilon 3) = 1.0$$

or $$\frac{\frac{I1}{2}}{\frac{I1}{2}+IX} = \frac{1}{(1+\epsilon 1)(1+\epsilon 2)(1+\epsilon 3)} \cong (1-\epsilon 1)(1-\epsilon 2)(1-\epsilon 3)$$

$$\cong 1 - (\epsilon 1 + \epsilon 2 + \epsilon 3)$$

if $\epsilon 1, \epsilon 2, \epsilon 3 << 1.0.$

If $IX << I1/2,$ $\frac{\frac{I1}{2}}{\frac{I1}{2}+IX} \cong 1 - \frac{IX}{\frac{I1}{2}},$ and IX has the following value to get zero offset:

$$\frac{1}{1+\frac{IX}{I1/2}} = 1 - \frac{IX}{I1/2}$$

$$IX = \frac{I1}{2}(\epsilon 1 + \epsilon 2 + \epsilon 3)$$

Therefore, by compensating in accordance with the above equation for IX, the output offset resulting from mismatches of pairs Q3/Q4, D1/D2 and RL1/RL2 is eliminated independent of gain or temperature. Output offset resulting from mismatches of pairs Q1/Q2 and RE1/RE2 are of lesser magnitude and may be cancelled with IX; however, the cancellation will not be gain or temperature independent.

Figure 2:
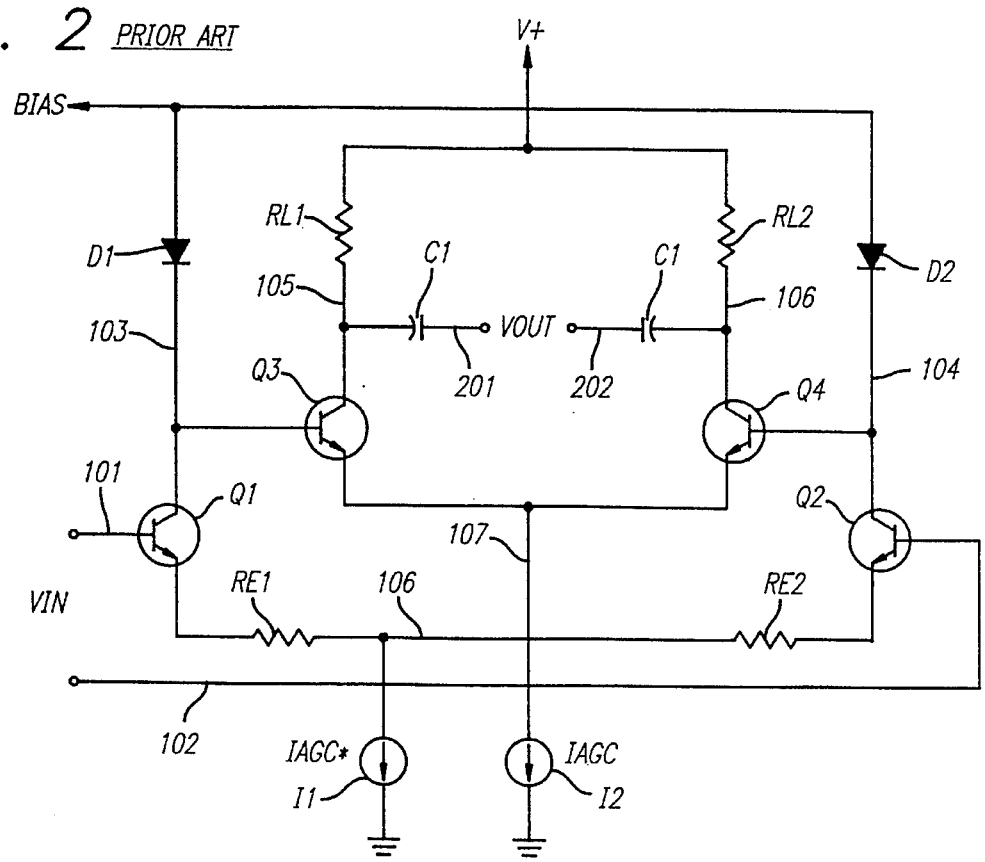
FIG. 2 illustrates a schematic diagram of a prior art approach to offset voltage trim of AGCs.

FIG. 2 illustrates a schematic diagram of a prior art approach to offset voltage trim for AGCs. The circuit of FIG. 2 is similar to the circuit of FIG. 1, but with capacitor C1 interposed between node 105 and the first terminal of output VOUT and capacitor C2 interposed between node 106 and the second terminal of output VOUT. Node 105 is coupled to the first terminal of capacitor C1. The second terminal of capacitor C1 is coupled to node 201. Node 106 is coupled to the first terminal of capacitor C2. The second terminal of capacitor C2 is coupled to node 202. Output VOUT is provided across nodes 201 and 202.

The circuit of FIG. 2 eliminates DC offset voltages by AC coupling the output signal through capacitors C1 and C2. Capacitors C1 and C2 block DC voltages from passing through to output VOUT. However, it is difficult to fabricate capacitors having the values required of capacitors C1 and C2 on an integrated circuit. Thus, capacitors C1 and C2 must be provided as components external to an integrated circuit. Implementing capacitors C1 and C2 as external components typically requires the addition of four pins to the integrated circuit package. A first pin is necessary for the signal at node 105 to be provided to capacitor C1. A second pin is required to pass the signal back to the integrated circuit after it has passed through capacitor C1. A third pin is needed to couple the signal at node 106 to capacitor C2. A fourth pin is needed to pass the signal back to node 202 on the integrated circuit after it has passed through capacitor C2. To provide four additional pins on the integrated circuit package requires additional conductive paths on the integrated circuit, bonding pads, bonding wires and the pins themselves, and may necessitate the use of a larger integrated circuit package. Also required are additional solder joints and printed circuit board traces, as well as discrete capacitors C1 and C2. Thus, implementation of capacitors C1 and C2 as external components greatly increases the complexity of the AGC.

Figure 3:
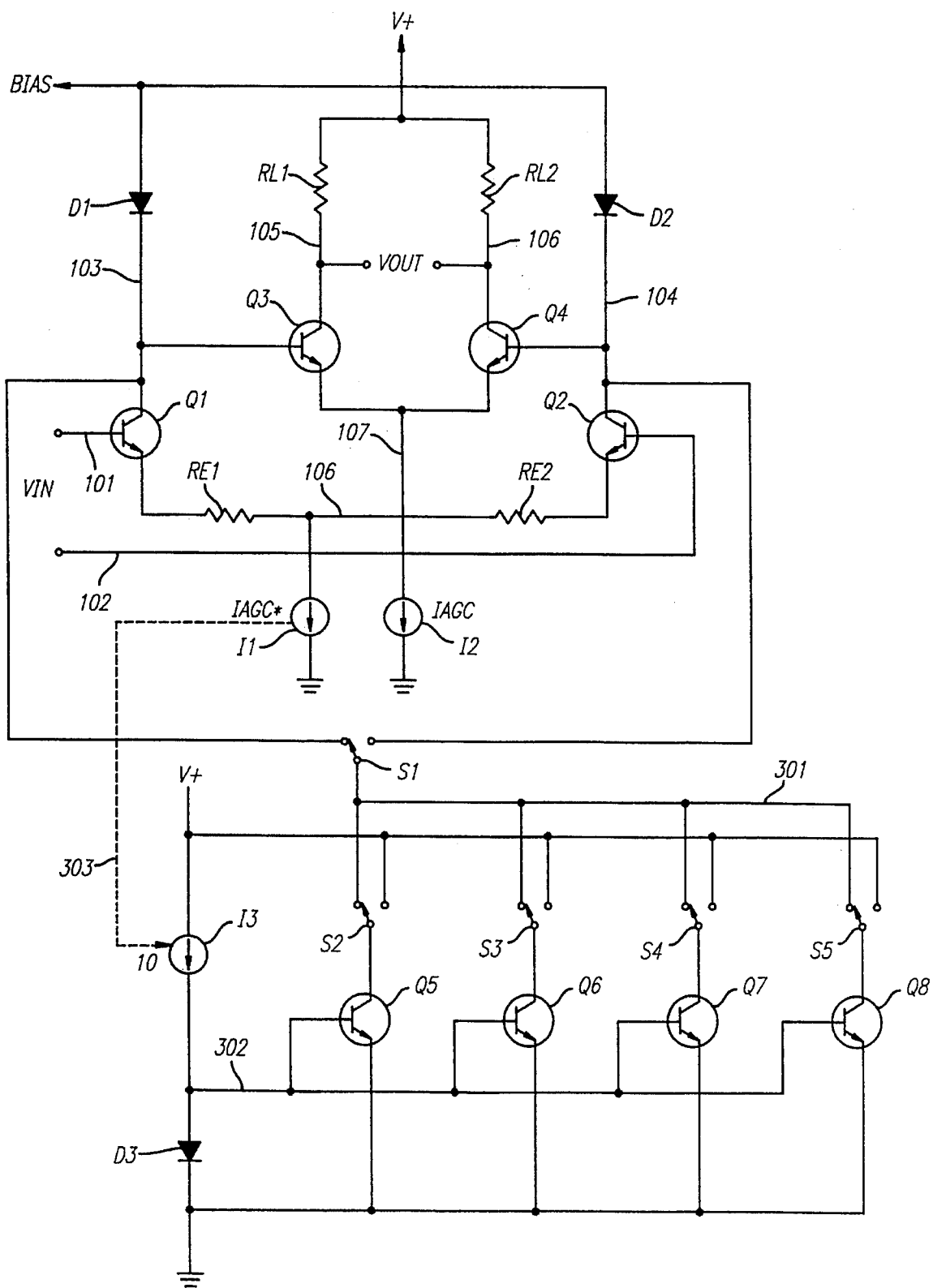
FIG. 3 illustrates a schematic diagram of the preferred embodiment of the present invention.

FIG. 3 illustrates a schematic diagram of the preferred embodiment of the present invention. Differential input VIN is provided across nodes 101 and 102. Node 101 is coupled to the base of transistor Q1. Node 101 is coupled to the base of transistor Q1. Node 102 is coupled to the base of transistor Q2. The emitter of transistor Q1 is coupled to the first terminal of resistor RE1. The emitter of transistor Q2 is coupled to the first terminal of resistor RE2. The second terminal of resistor RE1 is coupled to the second terminal of resistor RE2, to node 106 and to the first terminal of current source I1. The second terminal of current source I1 is coupled to ground.

The collector of transistor Q1 is coupled to node 103, to the cathode of diode D1 and to the base of transistor Q3. The collector of transistor Q2 is coupled to diode 104, to the cathode of diode D2 and to the base of transistor Q4. The anode of diode D1 is coupled to the anode of diode D2 and to voltage BIAS. The emitter of transistor Q3 is coupled to the emitter of transistor Q4, to node 107 and to the first terminal of current source I2. The second terminal of current source I2 is coupled to ground. Positive supply voltage V+ is coupled to the first terminal of resistor RL1 and to the first terminal of resistor RL2. The second terminal of resistor RL1 is coupled to the collector of transistor Q3 and to node 105. The second terminal of resistor RL2 is coupled to the collector of transistor Q4 and to node 106. Output VOUT is provided across nodes 105 and 106.

Node 103 is coupled to the first terminal of switch S1. Node 104 is coupled to the second terminal of switch S1. Common terminal of switch S1 is coupled to node 301, to the first terminal of switch S2, to the first terminal of switch S3, to tile first terminal of switch S4 and to the first terminal of switch S5. Positive supply voltage V+ is coupled to the first terminal of current source I3, to the second terminal0 of switch S2, to the second terminal of switch S3, to the second terminal of switch S4 and to the second terminal of switch S5. The common terminal of switch S2 is coupled to the collector of transistor Q5. The common terminal of switch S3 is coupled to the collector of transistor Q6. The common terminal of switch S4 is coupled to the collector of transistor Q7. The common terminal of switch S5 is coupled to the collector of transistor Q8. The second terminal of current source I3 is coupled to the anode of diode D3, to node 302, to the base of transistor Q5, to the base of transistor Q6, to the base of transistor Q7 and to the base of transistor Q8.

The cathode of diode D3, the emitter of transistor Q5, the emitter of transistor Q6, the emitter of transistor Q7 and the emitter of transistor Q8 are all coupled to ground. Current I0, which is provided by current source I3, is dependent upon current IAGC*, which is provided by current source I1, as indicated by dashed line 303. In FIG. 3, input voltage VIN is applied across nodes 101 and 102 and appears across the bases of differential transistor pair Q1 and Q2. The current through transistors Q1 and Q2 is provided by current source I1. The signals from the collectors of transistors Q1 and Q2 are applied to nodes 103 and 104, respectively, and to the bases of transistors Q3 and Q4, respectively. Current through transistors Q3 and Q4 is provided by current source I2. The signals from tile collectors of transistors Q3 and Q4 are applied to nodes 105 and 106, respectively, frown which output voltage VOUT is taken. It is preferred that the sum of currents IAGC* from current source I1 and IAGC from current source I2 remains constant, but the ratio of current IAGC to current IAGC* may be varied to control the gain of the AGC amplifier.

Ideally, differential pairs Q1/Q2, Q3/Q4, D1/D2, RL1/RL2 and RE1/RE2 are produced, selected or adjusted to have perfectly matched parameters, such matching is difficult to achieve. If differential pairs Q3/Q4, D1/D2, RL1/RL2, Q1/Q2 or RE1/RE2 are mismatched, a DC offset voltage will be present at output VOUT. To compensate for this DC offset voltage, current may be added to or subtracted from node 103 or node 104, depending upon the polarity of the DC offset voltage. A programmable current source, such as that comprising current source I3, diode D3, transistors Q5, Q6, Q7 and Q8, and switches S1, S2, S3, S4 and S5 may be used to yield zero offset voltage.

Although the circuit of FIG. 3 illustrates the preferred embodiment of the present invention, alternate embodiments of the present invention are possible. For example, the present invention may be practiced with alternate current source and/or current control configurations. Furthermore, the present invention may be practiced with other switching techniques.

Figure 4:
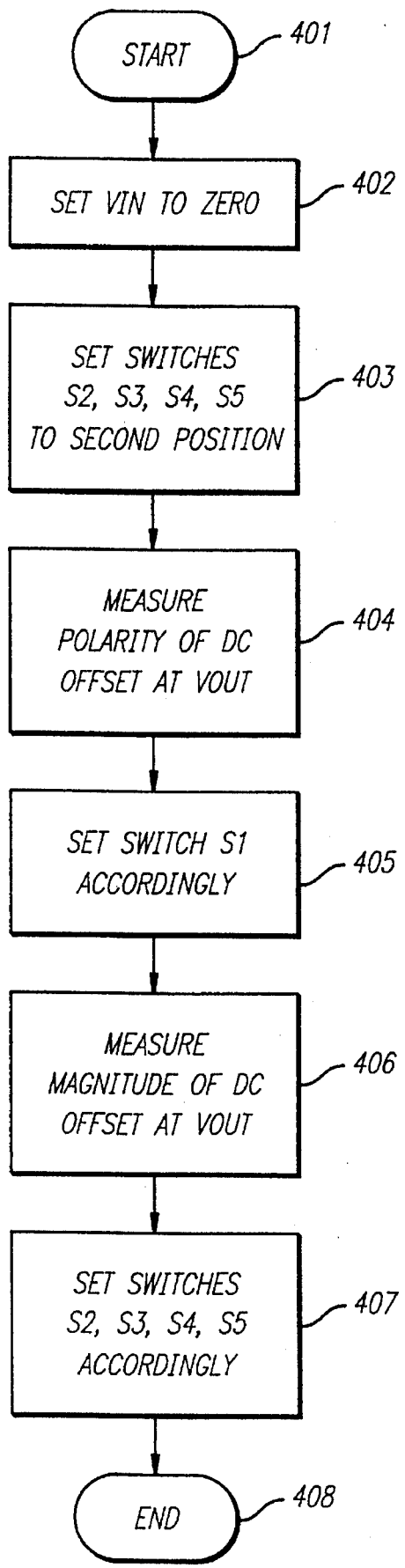
FIG. 4 illustrates a schematic diagram of an alternate embodiment of the present invention.

FIG. 4 illustrates a flowchart of a method for eliminating DC offset voltage in the circuit of FIG. 3 or similar circuits. The method begins at start block 401. In step 402, voltage VIN is set to zero. In step 403, switches S2, S3, S4 and S5 are set to their second position, which couples them to positive supply voltage V+. In step 404, a measurement of the polarity of the DC offset voltage at output VOUT is made. Depending on the measurement of step 404, switch S1 is set to either the first or second position in step 405. The magnitude of the DC offset at output VOUT is measured in step 406. In step 407, switches S2, S3, S4 and S5 are set according to the magnitude measurement of step 406. The method ends in end block 408.

The settings of switches S2, S3, S4 and S5 determine the magnitude of the trim current applied to nodes 103 or 104. Transistors Q5, Q6, Q7 and Q8 have semiconductor areas related by powers of two, so the amount of trim current contributed by these transistors differs and depends upon their semiconductor area. If transistor Q8 is represented as having a unit area, transistor Q7 has twice the unit area, transistor Q6 has four times the unit area and transistor Q5 has eight times the unit area. Multiple parallel transistors having a total area in the proper proportion to the area of the other transistors may be used to implement each or any of these transistors. By measuring the relationship between the DC offset voltage present at output VOUT and the currents provided by transistors Q5, Q6, Q7 and Q8, the correct settings of switches S2, S3, S4 and S5 may be determined for a value of DC offset voltage at output VOUT. Current provided by transistors Q5, Q6, Q7 and Q8 is dependent upon current I0 slaved to current source I3. Current source I3 is, then, dependent upon current source I1, as indicated by dashed line 303 of FIG. 3. Thus, the trim current provided at nodes 103 or 104 is dependent upon current source I1. Since changes in gain, temperature or other operating parameters will affect current source I1, the dependency of current source I3 on current source I1 will automatically adjust the trim current provided at node 103 or node 104 to compensate for these parameter changes.

Thus, offset voltage trim for AGCs independent of temperature or gain has been provided.

I claim:

1. Apparatus for trimming the offset voltage of an automatic gain control (AGC) circuit comprising:

a first differential pair of transistors;

a first current source coupled to said first differential pair of transistors for providing a first current having a first current magnitude;

a second differential pair of transistors coupled to said first differential pair of transistors, said second differential pair providing an output;

a second current source coupled to said second differential pair of transistors for providing a second current;

a trim current source switchably coupled to said first differential pair of transistors for providing an offset trim current to one of said first differential pair of transistors, the magnitude of said offset trim current dependent upon said first current magnitude.

2. The apparatus of claim 1 further comprising a programming means coupled to said trim current source, said programming means determining a nominal trim current magnitude and a trim current polarity.

3. The apparatus of claim 2 further comprising a first switch coupled to said first differential pair of transistors and to said programming means for selecting a side of said first differential pair of transistors to which said offset trim current is to be applied.

4. The apparatus of claim 2 wherein at least said first differential pair of transistors, said second differential pair of transistors, and said programming means are integrated on the same chip.

5. The apparatus of claim 2 wherein said programming means comprising a plurality of transistors coupled to a plurality of switches.

6. The apparatus of claim 5 wherein a first terminal of each of said plurality of switches is coupled to said first differential pair of transistors and a second terminal of each of said plurality of switches is coupled to a supply voltage.

7. The apparatus of claim 6 wherein said plurality of transistors have semiconductor areas related to each other by successive powers of two.

8. The apparatus of claim 7 further comprising a pair of diodes coupled to said first differential pair of transistors.

9. A method of offset trim comprising the steps of:

providing a first current source for controlling a current supplied to a first differential pair;

providing a second current source for controlling a current supplied to a second differential pair, said second differential pair coupled to output terminals to produce an output signal;

providing a third current source switchably coupled to said first differential pair for providing a trim current to one of said first differential pair of transistors;

adjusting said trim current such that DC offset of said output signal is substantially eliminated;

adjusting said third current source in response to said first current source.

10. The method of claim 9 wherein said step of adjusting said third current source occurs continuously.

11. The method of claim 10 further comprises the step of controlling a gain of said first differential pair by controlling said current supplied to said first differential pair.

12. A DC offset trim circuit for automatic gain controls comprising:

a first and a second transistors each having a base electrode for receiving an input signal, an emitter electrode, and a collector electrode;

a first current source coupled to said first and a second transistors;

a third and a fourth transistors each having a base electrode, an emitter electrode, and a collector electrode, said bases of said third and said fourth transistors coupled to said collectors of said first and said second transistors, said collectors of said third and said fourth transistors coupled to output terminals for providing an output signal;

a trim current source switchably coupled to said collectors of said first and said second transistors for providing a trim current such that when said trim current is applied to one of said collector electrodes of said first and said second transistors, DC offset of said output signal is substantially eliminated, said trim current source dependent upon said first current source.

13. The apparatus of claim 12 further comprising a programming means coupled to said trim current source, said programming means determining a nominal trim current magnitude and a trim current polarity.

14. The apparatus of claim 13 further comprising a first switch coupled to said first and said second transistors and to said programming means for selecting one of said first and said second transistors to which said offset trim current is to be applied.

15. The apparatus of claim 13 wherein at least said first, said second, said third, said fourth transistors, and said programming means are integrated on the same chip.

16. The apparatus of claim 13 wherein said programming means comprising a plurality of transistors switchably coupled to said first switch by a plurality of switches.

17. The apparatus of claim 16 wherein a first terminal of each of said plurality of switches is coupled to said first differential pair of transistors and a second terminal of each of said plurality of switches is coupled to a supply voltage.

18. The apparatus of claim 17 wherein said plurality of transistors have semiconductor areas related to each other by successive powers of two.

19. The apparatus of claim 18 further comprising a pair of diodes coupled to said first differential pair of transistors.

* * * * *